(12) United States Patent
Kotani et al.

(10) Patent No.: US 8,008,410 B2
(45) Date of Patent: Aug. 30, 2011

(54) EPOXY RESIN COMPOSITION FOR ENCAPSULATING SEMICONDUCTOR AND SEMICONDUCTOR DEVICE

(75) Inventors: Takahiro Kotani, Tokyo (JP); Yoshinori Nishitani, Tokyo (JP); Daisuke Oka, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 110 days.

(21) Appl. No.: 11/980,760

(22) Filed: Oct. 31, 2007

(65) Prior Publication Data

US 2008/0128922 A1 Jun. 5, 2008

(30) Foreign Application Priority Data

Nov. 15, 2006 (JP) ................................. 2006-308850

(51) Int. Cl.
*C08L 63/00* (2006.01)
*C08G 59/00* (2006.01)
*H01L 23/29* (2006.01)

(52) U.S. Cl. .. 525/524; 524/500; 257/793; 257/E23.119

(58) Field of Classification Search ................... 525/524; 257/793, E23.119; 524/500
See application file for complete search history.

(56) References Cited

U.S. PATENT DOCUMENTS

2002/0043728 A1 * 4/2002 Harada .......................... 257/787

FOREIGN PATENT DOCUMENTS

| JP | 4-217675 | 8/1992 |
|---|---|---|
| JP | 6-239970 | 8/1994 |
| JP | 8-127636 | 5/1996 |
| JP | 11-1541 | 1/1999 |
| JP | 11-147940 | 6/1999 |
| JP | 11147936 A1 | 6/1999 |
| JP | 2001-233936 | 8/2001 |
| JP | 2005-15689 | 1/2005 |
| JP | 2005015689 A * | 1/2005 |
| JP | 2005-97352 | 4/2005 |

OTHER PUBLICATIONS

English machine translation of JP Patent Pub No. 2005-015689 A, Ogura et al, Jan. 20, 2005.*
English machine translation of JP 2005-015689 A, Ogura et al, Jan. 20, 2005.*
Office Action received in CN 200780034308 mailed Dec. 31, 2010. English translation provided.

* cited by examiner

*Primary Examiner* — Mark Eashoo
*Assistant Examiner* — David Karst
(74) *Attorney, Agent, or Firm* — Smith, Gambrell & Russell, LLP

(57) ABSTRACT

There is provided an epoxy resin composition for encapsulating a semiconductor comprising an epoxy resin (A), wherein the epoxy resin (A) including: a crystalline epoxy resin (a1) having a melting point of 50° C. to 150° C., an epoxy resin (a2) represented by formula (1), and at least one epoxy resin (a3) selected from an epoxy resin represented by formula (2) and an epoxy resin represented by a formula (3):

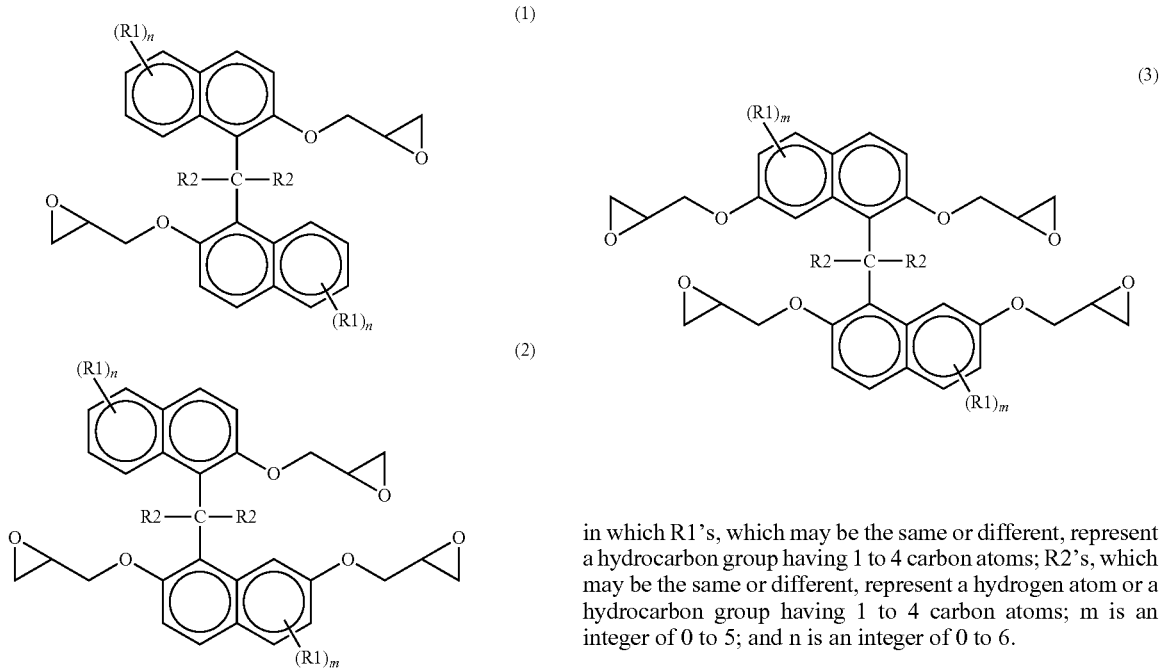
in which R1's, which may be the same or different, represent a hydrocarbon group having 1 to 4 carbon atoms; R2's, which may be the same or different, represent a hydrogen atom or a hydrocarbon group having 1 to 4 carbon atoms; m is an integer of 0 to 5; and n is an integer of 0 to 6.
14 Claims, 2 Drawing Sheets

EPOXY RESIN COMPOSITION FOR ENCAPSULATING SEMICONDUCTOR AND SEMICONDUCTOR DEVICE

This application is based on Japanese patent application No. 2006-308850, the content of which is incorporated hereinto by reference.

BACKGROUND

1. Technical Field

The present invention relates to an epoxy resin composition for encapsulating a semiconductor, and to a semiconductor device.

2. Related Art

The ongoing miniaturization, reduction in weight and progress in performance of electronic equipments have been accelerating the increase in level of integration of semiconductor chips (hereinafter, also referred to as "chip" or "element") to be incorporated. This has been creating, in the field of semiconductor devices (hereinafter, also referred to as "semiconductor package" or "package"), an increasing demand for area surface mount semiconductor packages, as a substitution for the packages of conventional structure.

The area surface mount semiconductor package has been developed in view of the fact that the conventional surface mount packages, typically exemplified by a quad flat package (hereafter, referred to as "QFP") and small outline package (hereinafter, referred to as "SOP"), can no longer cope with the currently required high pin count and high operation speed. Typical examples of the area surface mount semiconductor package include a ball grid array (hereinafter, also referred to as "BGA"), and a chip size package (hereinafter, also referred to as "CSP") which is designed in an even smaller size. The area surface mount semiconductor package has such a structure that the semiconductor chips are mounted on a side of a hard circuit substrate, typically including a bismaleimide triazine resin (hereinafter, referred to as "BT resin")/copper foil circuit substrate, or on a side of a flexible circuit substrate, typically including a polyimide resin film/copper foil circuit substrate, and the surface on which the chips are mounted, i.e. only one side is molded and encapsulated by a resin composition for encapsulating a semiconductor (hereinafter, also referred to as "encapsulating material" or "encapsulating resin"). On the opposite side of the substrate, bump electrodes such as solder balls are aligned in a grid pattern, for junction with a mother board implemented on the package surface. Further, newly developed substrates on which the chips are be mounted include a metal substrate such as a lead frame, in addition to the foregoing organic circuit substrate.

Generally the area surface mount semiconductor package bears a one-side encapsulation structure in which only one side of the substrate on which the chips are mounted is encapsulated by a resin composition, leaving the other side provided with the solder balls uncovered. In the case where the metal substrate such as a lead frame is employed for mounting the chips thereon, an encapsulating resin layer may be rarely provided in a thickness of scores of microns on the substrate surface provided with the solder balls.

However, the encapsulating resin layer formed on the surface with the chips has a thickness of hundreds of microns to several millimeters, and hence all the area surface mount semiconductor packages may practically be regarded as having a one-side encapsulation structure. Accordingly, the area surface mount semiconductor package is prone to incur a warp immediately after the molding, because of unmatched thermal expansion or thermal shrinkage between the organic substrate or metal substrate and the cured resin composition, or because of an effect of curing shrinkage of the resin composition which occurs during the molding and curing process. Also, the area surface mount semiconductor package is normally subjected to a post-curing process after the molding, during which the warp may be worsened because of the reheating. This may interrupt the transportation of the packages by the carrying apparatus.

After encapsulating process, the manufacturing process of the area surface mount semiconductor package may include the steps of, in this order, (a) providing a solder ball, (b) drying, and (c) mounting a mother board. In the step (a), the package is heated to the solder reflow temperature to form the solder electrodes. In the step (b), the package is treated under a temperature of, for example, 100° C. to 150° C., for several hours. Then in the step (c), similar steps to those of the step (a) are performed. Generally, the area surface mount semiconductor package is warped immediately after the encapsulation process, and becomes concave with the surface that has been encapsulated (hereinafter, also referred to as "encapsulated surface") oriented to face upward (under room temperature), because of a difference in linear expansion coefficient between the cured encapsulating material and the substrate, the curing shrinkage of the encapsulating material and so forth. Then through the steps (a) and (b), the package is deformed so as to reduce a degree of the concave (under a room temperature). This owes to the difference in linear expansion coefficient between the cured encapsulating material and the substrate, or to stress relaxation of the encapsulating material. Further, when the package is exposed to the solder reflow temperature (melting point of the solder) in the step (c), the package is largely bent and becomes convex. Such warp is prone to cause a central portion of the package to lift, and to provoke solder bridging at a peripheral portion, during the solder reflow step of the surface mounting process. These phenomena often leads, when implementing the solder balls to the mother board, to defective connection, or presence of great residual stress in the solder connection point even though the connection is achieved at all, and also to emergence of defective connection during the subsequent temperature cycle test or the like. Such drawback is more visible especially in the case where the substrate is relatively thin or where the solder balls are relatively small in diameter.

In order to address the foregoing drawback, various attempts have been made to improve the encapsulating resin. Possible remedies include (1) increasing the glass transition temperature (hereinafter, referred to as "Tg") of the cured material, and (2) controlling the linear expansion coefficient. Specifically, for example in Japanese Laid-open Publication No. H11-147940, it is proposed that by combining a triphenolmethane type epoxy resin and a triphenolmethane type phenol resin, it is possible to increase the Tg of the cured resin composition, thereby reduce the curing shrinkage during the molding process of the resin composition. Also, in Japanese Laid-open Publication No. H11-1541, is proposed that by employing a resin having low melt viscosity, it is possible to increase the content of an inorganic filler, thereby adjust the linear expansion coefficient α1 of the cured resin composition at a temperature not higher than the Tg thereof, to the linear expansion coefficient of the substrate. Further, such method has been proposed as employing a resin containing a naphthalene ring structure to thereby reduce the linear expansion coefficient (see, for example, Japanese Laid-open Publication No. H08-127636, Japanese Laid-open Publication No. 2001-233936, Japanese Laid-open Publication No. H04-217675, and Japanese Laid-open Publication No. H06-239970).

Although the foregoing remedies achieve certain improvement, still the improvement is not satisfactory with respect to a package with a thin substrate or small-diameter solder balls, and besides the moldability of the resin, such as flowability, is to be improved.

SUMMARY OF THE INVENTION

It is an object of the present invention to provide an epoxy resin composition for encapsulating a semiconductor having high flowability and low stress generation property so as to reduce, especially in a manufacturing process of an area surface mount semiconductor device, fluctuation in warp under room temperature after each of the steps from resin encapsulation to surface mounting, and to reduce warp under high temperature during the surface mounting process, as well as a semiconductor device using such resin composition.

According to one embodiment of the invention, there is provided an epoxy resin composition for encapsulating a semiconductor comprising an epoxy resin (A), wherein the epoxy resin (A) including:

a crystalline epoxy resin (a1) having a melting point of 50° C. to 150° C., an epoxy resin (a2) represented by formula (1), and at least one epoxy resin (a3) selected from an epoxy resin represented by formula (2) and an epoxy resin represented by a formula (3), wherein the epoxy resin (a1) is different from the epoxy resin (a2) and the epoxy resin (a3);

wherein the composition has a spiral flow of 80 cm or more measured according to EMMI-1-66 method;

the composition in the cured state has a glass transition temperature of 150° C. or higher; and the composition in the cured state has a linear expansion coefficient of 5 ppm/° C. to 10 ppm/° C., at a temperature not higher than the glass transition temperature of the composition:

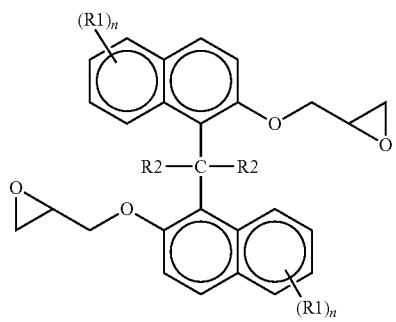

wherein, in formula (1), R1's, which may be the same or different, represent a hydrocarbon group having 1 to 4 carbon atoms; R2's, which may be same or different, represent a hydrogen atom or a hydrocarbon group having 1 to 4 carbon atoms; and n is an integer of 0 to 6;

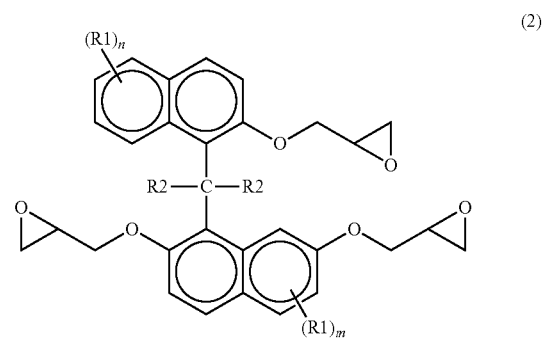

wherein, in formula (2), R1's, which may be same or different, represent a hydrocarbon group having 1 to 4 carbon atoms; R2's, which may be the same of different, represent a hydrogen atom or a hydrocarbon group having 1 to 4 carbon atoms; m is an integer of 0 to 5; and n is an integer of 0 to 6;

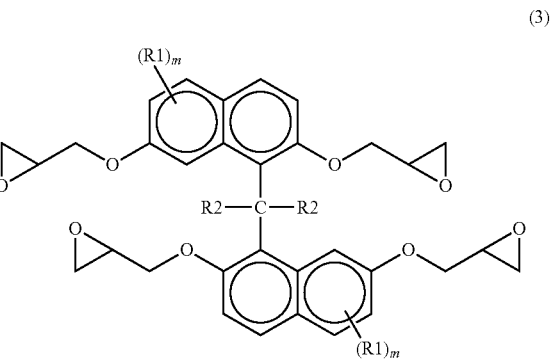

wherein, in formula (3), R1's, which may be the same or different, represent a hydrocarbon group having 1 to 4 carbon atoms; R2's, which may be the same or different, represent a hydrogen atom or a hydrocarbon group having 1 to 4 carbon atoms; and m is an integer of 0 to 5.

According to one embodiment, the crystalline epoxy resin (a1) is at least one selected from the group consisting of a biphenyl type epoxy resin, a bisphenol type epoxy resin, a stilbene type epoxy resin, a dihydroxybenzene type epoxy resin, and a naphthalene type epoxy resin.

According to one embodiment, the epoxy resin (a1) is in an amount of 60 wt % to 95 wt % based on the total amount of the epoxy resin (a1), the epoxy resin (a2), and the epoxy resin (a3).

According to one embodiment, the epoxy resin (a1) is in an amount of 60 wt % to 95 wt %, the epoxy resin (a2) is in an amount of 2.5 wt % to 20 wt %, and the epoxy resin (a3) is in an amount of 2.5 wt % to 20 wt %, based on the total amount of the epoxy resin (a1), the epoxy resin (a2), and the epoxy resin (a3).

According to one embodiment, the epoxy resin composition comprises a phenol resin curing agent (B).

According to one embodiment, the epoxy resin composition comprises an inorganic filler (C).

According to one embodiment, the epoxy resin composition comprises a curing accelerator (D).

According to one embodiment, the epoxy resin composition has a spiral flow of 120 cm or more measured according to EMMI-1-66 method.

According to another embodiment, there is provided a semiconductor device comprising a semiconductor chip encapsulated with the epoxy resin composition.

According to still another embodiment, there is provided an epoxy resin composition for encapsulating an area surface mount semiconductor, wherein the area surface mount semiconductor comprises a semiconductor chip mounted on substantially one side of a substrate by encapsulating with the composition.

According to still another embodiment, there is provided An area surface mount semiconductor device, comprising a semiconductor chip mounted on one side of a substrate; wherein the semiconductor chip on one side of the substrate is encapsulated with the epoxy resin composition for encapsulating an area surface mount semiconductor.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
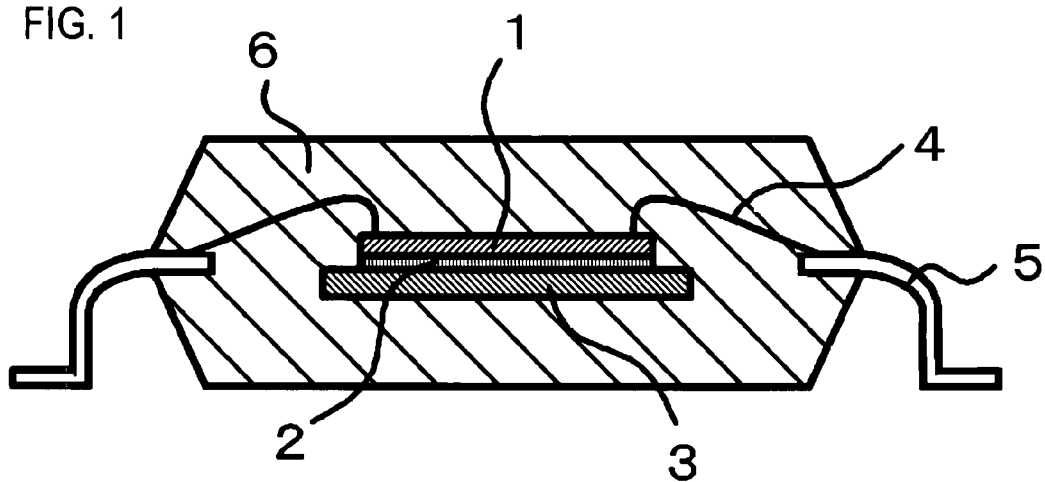
FIG. 1 shows a cross-sectional view of a semiconductor device that includes an epoxy resin composition according to the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

It is provided an epoxy resin composition for encapsulating a semiconductor comprising an epoxy resin (A), wherein the epoxy resin (A) including; a crystalline epoxy resin (a1) having a melting point of 50° C. to 150° C., an epoxy resin (a2) represented by a formula (1), and at least one epoxy resin (a3) selected from an epoxy resin represented by a formula (2) and an epoxy resin represented by a formula (3), wherein the epoxy resin (a1) is different from the epoxy resin (a2) and the epoxy resin (a3);

wherein the composition has a spiral flow of 80 cm or more measured according to EMMI-1-66 method;

the composition in the cured state has a glass transition temperature of 150° C. or higher; and the composition in the cured state has a linear expansion coefficient of 5 ppm/° C. to 10 ppm/° C., at a temperature not higher than the glass transition temperature of the composition. According to the present invention, it can be obtained a resin composition having high flowability and low stress generation property, thus reduced fluctuation in warp occured during the manufacturing process. Hereafter, each of the components will be described in details.

According to the present invention, it is preferable that the epoxy resin (A) includes a crystalline epoxy resin (a1) having a melting point of 50° C. to 150° C., an epoxy resin (a2) represented by formula (1) as shown below, and at least one epoxy resin (a3) selected from an epoxy resin represented by formula (2) as shown below and an epoxy resin represented by formula (3) as shown below, provided that the component (a1) is different from the component (a2) and the component (a3). Although the amount of the component (a1), the component (a2), and the component (a3) is not specifically limited, it is preferable that the component (a1) is in an amount of 60 wt % to 95 wt %, the component (a2) is in an amount of 2.5 wt % to 20 wt %, and the component (a3) is in an amount of 2.5 wt % to 20 wt %, based on the total amount of the component (a1), the component (a2), and the component (a3). By using the such components in the amount within foregoing range, the obtained resin composition may have a high flowability and low stress generation property, thereby it would be possible to reduce, especially in the manufacturing process of the area surface mount semiconductor device, fluctuation in warp under room temperature after each of the steps from the resin encapsulating to the surface mounting, and to reduce warp under the high temperature during the surface mounting process.

Although in Japanese Laid-open Publication No. H6-239970, it is disclosed that the component (a1) and the component (a3) are used in combination, increasing the ratio of the component (a1) in order to obtain sufficient flowability leads to reduced Tg of the cured resin composition because in this case the component (a2) is absent, thus failing to attain sufficiently low stress generation property, in particular, sufficient reduction in fluctuation of the warp. On the other hand, increasing the ration of the component (a3) in order to attain lower stress generation property leads to degraded flowability in the encapsulating process, thereby provoking defects such as short mold and gold wire sweep.

Similarly, although in Japanese Laid-open Publication No. H4-217675, it is disclosed that the component (a2) and the component (a3) are used in combination, the absence of the component (a1) in this case leads to degraded flowability, which is especially disadvantageous for manufacturing the area surface mount semiconductor package, in which the majority of the gaps to be encapsulated are very narrow. Also, compared with the case that a biphenyl type epoxy resin, a bisphenol type epoxy resin, a stilbene type epoxy resin, or a dihydroxybenzene type epoxy resin which contribute to reducing elasticity at high temperature is used as the component (a1) along with the component (a2) and the component (a3), a composition comprising only the components (a2) and (a3) has an excessively high elasticity at high temperature, which leads to increased warp under the high temperature during the surface mounting process. Consequently, the semiconductor device incurs a warp when performing the soldering on a circuit substrate on which the semiconductor device is mounted thereby impeding a number of solder balls from being formed on a flat plane such that the solder balls is lifted from the circuit substrate on which the semiconductor device is mounted, and thus degrading the reliability in electrical connection.

The crystalline epoxy resin (a1) having a melting point of 50° C. to 150° C. used in the resent invention contributes to increasing the flowability of the encapsulating resin. It is preferable that the amount of the component (a1) is 60 wt % to 95 wt %, based on the total amount of the component (a1), the component (a2), and the component (a3). Setting the ratio of the component (a1) in the foregoing range allows securing sufficient flowability, even when employed for the area surface mount semiconductor package in which the majority of the gaps to be encapsulated are very narrow.

The epoxy resin (a1) according to the present invention refers to a crystalline epoxy resin having a melting point of 50° C. to 150° C., in the absence of the component (a2) and the component (a3). The crystalline epoxy resin refers to an epoxy resin that exhibits a crystalline property under room temperature (25° C.), and a prominent feature thereof is that the epoxy resin attains, despite being a solid resin under room temperature, low viscosity similar to that of a fluid resin once melted. Although the viscosity of the crystalline epoxy resin is not specifically limited, a preferable range of the melt viscosity at 150° C. is a range between 0.01 poise and 0.50 poise, when measured with an ICI melt viscosity meter. Examples of the crystalline epoxy resin having a melting point of 50° C. to 150° C. include a biphenyl type epoxy resin, a bisphenol type epoxy resin, a stilbene type epoxy resin, a dihydroxybenzene type epoxy resin, and a naphthalene type epoxy resin. Among them, the biphenyl type epoxy resin and the bisphenol type epoxy resin are preferable from the viewpoint of flowability.

Examples of the biphenyl type epoxy resin include a glycidyl ether compound of 4,4'-dihydroxybiphenyl,
4,4'-dihydroxy-3,3',5,5'-tetramethylbiphenyl,
4,4'-dihydroxy-3,3'-ditertiarybutyl-6,6'-dimethylbiphenyl,
2,2'-dihydroxy-3,3'-ditertiarybutyl-6,6'-dimethylbiphenyl,
4,4'-dihydroxy-3,3'-ditertiarybutyl-5,5'-dimethylbiphenyl,
4,4'-dihydroxy-3,3',5,5'-tetratertiary butylbiphenyl (including an isomer thereof with a different substitution position). In particular,
4,4'-bis(2,3-epoxypropoxy)-3,3',5,5'-tetramethylbiphenyl is preferable, from the viewpoint of flowability.

Examples of the bisphenol type epoxy resin include a glycidyl ether compound of 4,4'-methylenebis(2-methylphenol),
4,4'-methylenebis(2,6-dimethylphenol),
4,4'-methylenebis(2,3,6-trimethylphenol),
4,4'-ethylidenebis(2,6-dimethylphenol),
4,4'-(1-methylethylidene)bis(2-methylphenol),
4,4'-(1-methylethylidene)bis(2,6-dimethylphenol),
4,4'-(1-methylethylidene)bis[2-(1-methylethyl)phenol],
4,4'-bis(2,3-hydroxypropyloxy)-2,2'-dimethyl-5,5'-ditertiarybutyldiphenylsulfide, 4,4'-dihydroxydiphenylsulfone, and
bis[4-(hydroxyethoxy)phenyl]sulfone. In particular, 2,2'-bis[4-(2,3-epoxypropoxyphenyl)]propane and
bis[4-(2,3-epoxypropoxyphenyl)]methane are preferable, from the viewpoint of flowability (low viscosity).

Examples of the stilbene type epoxy resin include a glycidyl ether compound of
3-tertiarybutyl-2,4'-dihydroxy-3',5',6-trimethylstilbene,
3-tertiarybutyl-4,4'-dihydroxy-3',5',6-trimethylstilbene,
3-tertiarybutyl-4,4'-dihydroxy-3',5,5'-trimethylstilbene,
4,4'-dihydroxy-3,3',5,5'-tetramethylstilbene,
4,4'-dihydroxy-3,3'-ditertiarybutyl-6,6'-dimethylstilbene,
2,2'-dihydroxy-3,3'-ditertiarybutyl-6,6'-dimethylstilbene,
2,4'-dihydroxy-3,3'-ditertiarybutyl-6,6'-dimethylstilbene,
2,2'-dihydroxy-3,3',5,5'-tetramethylstilbene,
4,4'-dihydroxy-3,3'-ditertiarybutyl-5,5'-dimethylstilbene
(including an isomer thereof with a different substitution position).

Examples of the dihydroxybenzene type epoxy resin include a glycidyl ether compound of 2,5-di(n-butyl)hydroquinone,
2,5-di(tertiarybutyl)hydroquinone, 2,5-dipentylhydroquinone,
2,5-dihexylhydroquinone, 2,5-diheptylhydroquinone,
2,5-dioctylhydroquinone, 2,5-dinonylhydroquinone, and
2,5-didecylhydroquinone.

Examples of the naphthalene type epoxy resin include a glycidyl ether compound of 1,6-dihydroxynaphthalene.

The foregoing compositions may be used alone or in combination of two or more thereof.

According to the present invention, the epoxy resin (a2) represented by formula (1) as shown below is essential component for attaining both of the flowability of the encapsulating resin and the low stress generation property, especially the warp characteristic of the area surface mount semiconductor package. It is preferable that the amount of the component (a2) is 2.5 wt % to 20 wt %, based on the total amount of the component (a1), the component (a2), and the component (a3). Setting the ratio of the component (a2) in the foregoing range allows achieving an optimal balance between the flowability of the encapsulating resin and the low stress generation property, especially the warp characteristic of the area surface mount semiconductor package. The epoxy resin (a2) represented by formula (1) has high crystallizing property, and therefore excess amount of the component (a2) from the foregoing range leads to degraded solubility during the manufacturing process of the resin composition, thus resulting in failure in uniformly preparing the resin composition.

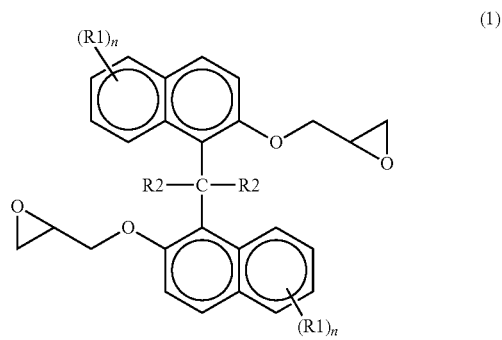

(1)

wherein, in formula (1), R1's, which may be the same or different, represent a hydrocarbon group having 1 to 4 carbon atoms; R2's, which may be same or different, represent a hydrogen atom or a hydrocarbon group having 1 to 4 carbon atoms; and n is an integer of 0 to 6.

According to the present invention, at least one epoxy resin (a3) selected from the epoxy resin represented by formula (2) and the epoxy resin represented by formula (3), contributes to increasing the low stress generation property, thereby reducing the fluctuation in warp of the area surface mount semiconductor package. It is preferable that the amount of the component (a3) is 2.5 wt % to 20 wt % based on the total amount of the component (a1), the component (a2), and the component (a3). Setting the ratio of the component (a2) in the foregoing range allows preparing an epoxy resin composition having excellently low stress generation property. Also, setting the mixing ratio of the component (a2) in the foregoing range contributes to increasing the glass transition temperature of the cured resin composition, thereby obtaining a resin composition with reduced fluctuation in warp under room temperature after each of the steps from the resin encapsulation to the surface mounting in the manufacturing process of the area surface mount semiconductor device, and reduced warp under the high temperature during the surface mounting process.

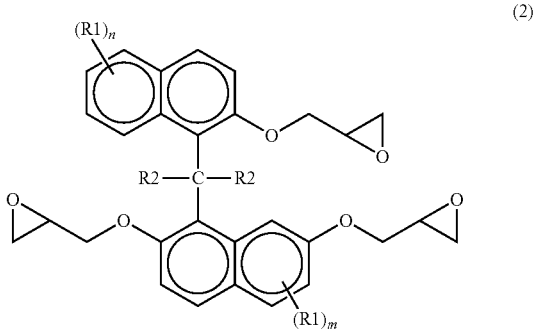

(2)

wherein R1's, which may be the same or different, represent a hydrocarbon group having 1 to 4 carbon atoms; R2's, which may be the same or different, represent a hydrogen atom or a hydrocarbon group having 1 to 4 carbon atoms; m is an integer of 0 to 5; and n is an integer of 0 to 6.

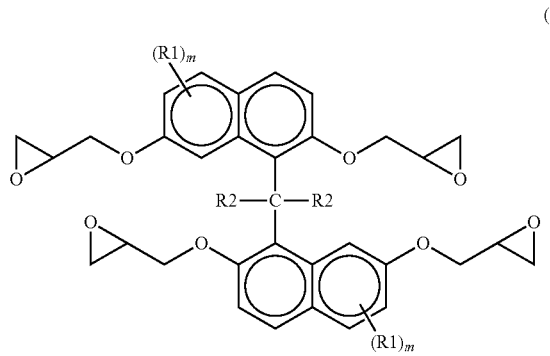

(3)

wherein R1's, which may be the same or different, represent a hydrocarbon group having 1 to 4 carbon atoms; R2's, which may be the same or different, represent a hydrogen atom or a hydrocarbon group having 1 to 4 carbon atoms; and m is an integer of 0 to 5.

Additionally, the epoxy resin represented by formula (1), the epoxy resin represented by formula (2), and the epoxy resin represented by formula (3) may be obtained, for example, by reacting β-naphthol, 2,7-dihydroxynaphthalene, and formaldehyde under the presence of a basic catalyst or an acid catalyst, for 0.5 to 30 hours under a temperature of 30 to 100° C., and subjecting the obtained product to glycidyletherification. The ratio of the epoxy resin represented by formula (1), the epoxy resin represented by formula (2), and the epoxy resin represented by formula (3) can be adjusted by varying the mole ration of the β-naphthol and the 2,7-dihydroxynaphthalene.

According to the present invention, any other epoxy resin may be additionally employed, as long as the advantage of employing the component (a1), the component (a2), and the component (a3) in combination remains undiluted. Examples of the epoxy resin that may be added include, but are not limited to, a novolac type epoxy resin, a phenolaralkyl type epoxy resin having a phenylene structure, a phenolaralkyl type epoxy resin having a biphenylene structure, a naphthol type epoxy resin, an anthracene type epoxy resin, an alkyl-modified triphenolmethane type epoxy resin, a triazine nuclear-containing epoxy resin, and a dicyclopentadiene-modified phenol type epoxy resin. When employing any of these epoxy resins, it is preferable that the amount thereof is 30 wt % or less based on the total amount of all the epoxy resins used, because otherwise the viscosity of the composition becomes higher during the encapsulating process, thereby degrading the flowability.

From the viewpoint of the reliability against moisture of the resin composition for encapsulating a semiconductor, it is preferable that the epoxy resin is as free as possible from ionic impurity, such as Na ion or Cl ion, and from the viewpoint of curability, it is preferable that the epoxy resin has an epoxy equivalent of 100 to 500 g/eq.

The phenol resin curing agent (B) used in the present invention may be those conventionally used for the encapsulating material. Examples of such agent include a phenol novolac resin, a cresol novolac resin, a dicyclopentadiene-modified phenol resin, a terpene-modified phenol resin, a phenol aralkyl resin having a phenylene structure, a phenol aralkyl resin having a biphenylene structure, a sulphor atom-containing phenol resin, a naphthol novolac resin, a naphthol-aralkyl resin having a phenylene structure, and a naphthol-aralkyl resin having a biphenylene structure, which may be employed alone or in combination of two or more thereof.

Preferably, the ratio of the total amount of the epoxy resins employed and the total amount of the phenol resin curing agents which are used in the present invention is adjusted such that the ratio of the number of epoxy groups (EP) of all the epoxy resins to the number of phenolic hydroxyl group (OH) of all the phenol resin curing agents (EP/OH) is in the range between 0.6 and 1.5, and more preferably between 0.8 and 1.3. Setting the equivalent ratio as above allows preventing degradation in curability of the epoxy resin composition. Also, setting the equivalent ratio as above allows preventing degradation in glass transition temperature or moisture resistance of the cured epoxy resin composition.

Examples of the inorganic filler (C) that may be used in the present invention include fused silica, spherical silica, crystalline silica, alumina, silicon nitride, and aluminum nitride, which are conventionally employed for the encapsulating material. It is preferable that the diameter of the inorganic filler (C) is 0.01 μm to 150 μm, from the viewpoint of the filling property. Preferably, the content of the inorganic filler (C) is 80 wt % to 92 wt %, and more preferably 84 wt % to 90 wt %, based on the total amount of the epoxy resin composition. Setting the mixing ratio of the inorganic filler (C) as above allows reducing the warp of the cured epoxy resin composition, and reducing the water absorption. Also, setting the mixing ratio of the inorganic filler (C) as above allows attaining excellent solder resistance without compromise in strength. Setting the mixing ratio of the inorganic filler (C) as above further allows attaining excellent moldability without compromise in flowability.

The curing accelerator (D) which may be employed in the present invention may be any accelerator that accelerates the curing reaction between the epoxy group of the epoxy resin and the phenolic hydroxyl group of the phenol resin curing agent, such as those conventionally used for the encapsulating material. Examples of such accelerator include amine compounds such as tributylamine and 1,8-diazabicyclo (5,4,0) undecene-7, organic phosphor-based compounds such as triphenylphosphine and tetraphenylphosphonium.tetraphenylborate salt, imidazole compounds such as 2-methylimidazole, and an onium salt.

The epoxy resin composition for encapsulating a semiconductor according to the present invention may optionally comprise, in addition to the foregoing materials, various additives including a flame retardant such as brominated epoxy resin, antimony trioxide, aluminum hydroxide, magnesium hydroxide, zinc borate, zinc molybdate, or phosphazene; a natural wax such as Carnauba wax, a synthetic wax such as polyethylene wax, a higher fatty acid such as stearic acid or zinc stearate and a metal salt thereof or a mold release agent such as paraffin; a silane coupling agent such as epoxysilane, mercaptosilane, aminosilane, alkylsilane, ureidosilane, or vinylsilane, a coupling agent such as titanate coupling agent, aluminum coupling agent, aluminum/zirconium coupling agent; a coloring agent such as carbon black or bengala; a low-stress component such as butadiene rubber, acrylonitrile modified butadiene rubber, silicone oil, or silicone rubber; and an inorganic ion exchanger for reducing ionic impurity.

The epoxy resin composition for encapsulating a semiconductor according to the present invention may be prepared by uniformly mixing the components (A) to (D) and other additives under normal temperature with a mixer or the like, melting and mixing the resulted mixture by a heating roll, a kneader or an extruder, cooling and crushing the resultant, and optionally adjusting their dispersion or flowability.

It is preferable that the epoxy resin composition for encapsulating a semiconductor according to the present invention has a spiral flow of 80 cm or more measured according to EMMI-1-66. Setting the spiral flow in such range allows preventing emergence of defects such as short mold and gold wire sweep, in the encapsulation process of the semiconductor packages in general. More preferably, the epoxy resin composition for encapsulating a semiconductor according to the present invention has a spiral flow of 120 cm measured according to EMMI-1-66. Setting the spiral flow in such range allows preventing emergence of defects such as short mold and gold wire sweep, even in the encapsulation process of the area surface mount semiconductor package in which the majority of the gaps to be encapsulated are very narrow. Also, the epoxy resin composition for encapsulating a semiconductor according to the present invention in the cured state should have a glass transition temperature of 150° C. or higher, and a linear expansion coefficient of 5 ppm/° C. to 10 ppm/° C. at a temperature not higher than the glass transition temperature of the cured epoxy resin composition. Employing the three types of epoxy resins (a1), (a2), and (a3) in combination, setting the glass transition temperature of the cured resin composition at 150° C. or higher, and setting the linear expansion coefficient of the cured resin composition at a temperature not higher than the glass transition temperature thereof in the range of 5 ppm/° C. to 10 ppm/° C. enable attaining excellent low stress generation property, and thereby reducing, especially in the manufacturing process of the area surface mount semiconductor device, fluctuation in warp under room temperature after each of the steps from the resin encapsulation to the surface mounting, and the warp under high temperature during the surface mounting process.

Methods of setting the spiral flow characteristic of the resin composition according to EMMI-1-66 at 80 cm or more, setting the glass transition temperature of the cured resin composition at 150° C. or higher, and setting the linear expansion coefficient of the cured resin composition at a temperature not higher than the glass transition temperature thereof in the range of 5 ppm/° C. to 10 ppm/° C. include adjusting the mixing ratio of the component (a1), the component (a2), and the component (a3), which are the essential components, and the mixing ratio of the inorganic filler (C).

A method for manufacturing a semiconductor device by encapsulating a semiconductor chip with the epoxy resin composition of the present invention may includes, for example, placing a lead frame or a circuit substrate or the like on which the semiconductor chip is mounted in a cavity of a mold, and curing and molding the epoxy resin composition using a technique such as transfer molding, compression molding or injection molding.

Although the semiconductor chips that can be encapsulated by the resin composition according to the present invention are not specifically limited, include an integrated circuit (IC), a large-scale integrated circuit (LSI), a transistor, a thyristor, a diode, and a solid-state imaging device.

The semiconductor device according to the present invention includes a dual in-line package (DIP), a plastic leaded chip carrier (PLCC), a quad flat package (QFP), a small outline package (SOP), a small outline J-leaded package (SOJ), a thin small outline package (TSOP), a thin quad flat package (TQFP), a tape carrier package (TCP), a ball grid array (BGA), and a chip scale package (CSP), but not be limited to.

The semiconductor device which has been encapsulated through the transfer molding process or the like is completely cured as it is, or under a temperature of 80° C. to 200° C., over a period of 10 minutes to 10 hours, and then mounted on an electronic equipment or the like.

FIG. 1 is a cross-sectional view of a semiconductor device using the epoxy resin composition according to the present invention. A semiconductor chip 1 is fixed on a die pad 3 via a cured die bond material 2. An electrode pad of the semiconductor chip 1 and a lead frame 5 are connected via a gold wire 4. The semiconductor chip 1 is encapsulated with a cured encapsulating resin composition 6.

Figure 2:
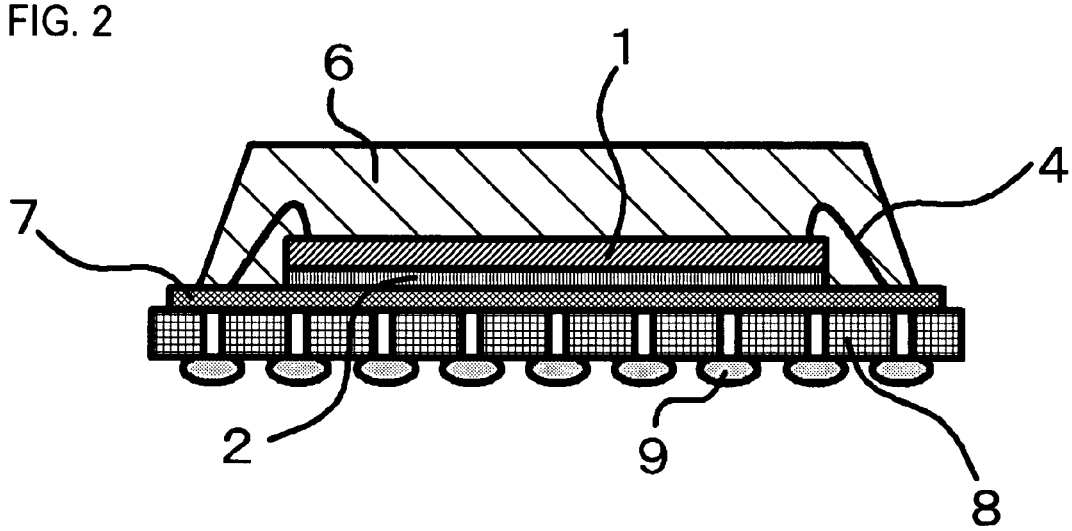
FIG. 2 shows a cross-sectional view of a semiconductor device of one-side encapsulation structure that includes the epoxy resin composition according to the present invention.

FIG. 2 is a cross-sectional view of a semiconductor device of one-side encapsulation structure using the epoxy resin composition according to the present invention. A semiconductor chip 1 is fixed on a substrate 8 via a cured die bond material 2. An electrode pad of the semiconductor chip 1 and an electrode pad on the substrate 8 are connected via a gold wire 4. Only the side of the substrate 8 on which the semiconductor chip 1 is mounted is encapsulated with a cured encapsulating resin composition 6. The electrode pad on the substrate 8 is internally connected to a solder ball 9 provided on the non-encapsulated surface of the substrate 8.

Figure 3:
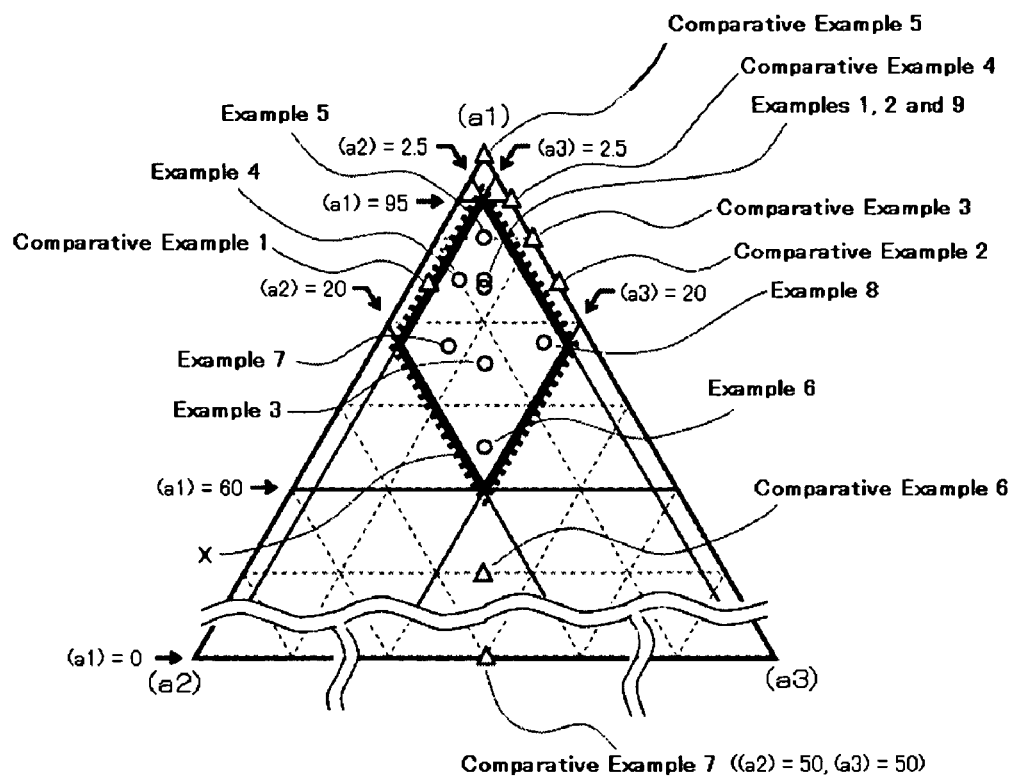
FIG. 3 is a three-component diagram showing an amount of a component (a1), a component (a2) and a component (a3) in an epoxy resin (A) in Examples and Comparative Examples described hereafter.

FIG. 3 is a three-component diagram showing mixing ratios of the component (a1), the component (a2) and the component (a3) in the epoxy resin (A), according to the examples and comparative examples. FIG. 3 includes plots indicating the mixing ratio of the component (a1), the component (a2) and the component (a3) in the epoxy resin (A) in the examples 1 to 9 and the comparative examples 1 to 7, as well as the preferable range X of the mixing ratio of the component (a1), the component (a2) and the component (a3) described above, indicated by diamond-shaped bold lines. The region X inside the diamond-shaped bold lines means preferable range described above, that is, for the component (a1), the range of 60 wt % to 95 wt %, for the component (a2), the range of 2.5 wt % to 20 wt %, and for the component (a3), the range of 2.5 wt % to 20 wt %.

EXAMPLES

Hereafter, the present invention will be specifically described based on the examples, however the present invention is in no way limited by these examples. The mixing ratio is expressed in part by weight.

Example 1

Epoxy resin 1: A biphenyl type crystalline epoxy resin including as a major component, 4,4'-bis(2,3-epoxypropoxy)-3,3'5,5'-tetramethylbiphenyl represented by the following formula (4) (YX-4000H manufactured by Japan Epoxy Resin Co., Ltd., epoxy equivalent of 186, melting point of 105° C., melt viscosity at 150° C. measured by an ICI melt viscosity meter of 0.15 poise)—6.14 parts by weight.

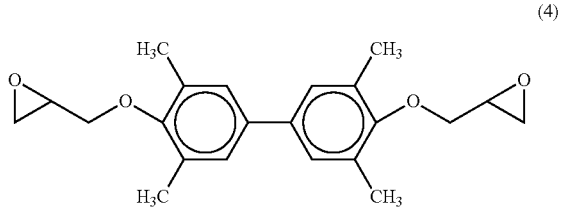

(4)

Epoxy resin 3: A mixture of 50 wt % of epoxy resin represented by formula (1) (n=0, and R2 is a hydrogen atom), 40 wt % of epoxy resin represented by formula (2) (m=0, n=0, and R2 is a hydrogen atom), and 10 wt % of epoxy resin represented by formula (3) (m=0, and R2 is a hydrogen atom) (HP-4770 manufactured by Dainippon Ink and Chemicals Incorporated, epoxy equivalent 204, softening point 72° C.)—1.10 parts by weight.

Phenol resin curing agent 1: Phenol novolac resin (PR-HF-3 manufactured by Sumitomo Bakelite Co., Ltd., hydroxyl group equivalent of 104, softening point of 80° C.)—3.96 parts by weight.

Inorganic filler: Fused spherical silica (Average particle diameter of 30 μm)—88.00 parts by weight.

Curing accelerator: Triphenylphosphin—0.20 parts by weight.

Mold release agent: Triglyceride montanate (Dropping point of 80° C.)—0.20 parts by weight.

Coupling agent 1: γ-glycidoxypropyltrimethoxy silane—0.10 parts by weight.

Coupling agent 2: γ-mercaptopropyltrimethoxy silane—0.10 parts by weight.

Coloring agent: Carbon black—0.20 parts by weight.

The above components were mixed under normal temperature in a mixer, melted and mixed by a heating roll of 80° C. to 100° C., cooled and then crushed to give an epoxy resin composition. Evaluation result thereof is shown in Table 1.

Spiral flow: The epoxy resin composition was transferred into a spiral flow measuring mold built according to EMMI-1-66 under such condition as mold temperature of 175° C., transfer pressure of 6.9 MPa, and hold time of 120 seconds, using a low-pressure transfer molding machine (KTS-15 manufactured by Kohtaki Precision Machine Co., Ltd.), and the flow length was measured. The spiral flow is a parameter of flowability, and a greater value indicates higher flowability. The unit is cm. It is preferable that the spiral flow is 80 cm or more, in the case of an encapsulating material for general semiconductor packages. In the case of an encapsulating material for the area surface mount semiconductor package, it is preferable that the spiral flow is 120 cm or more.

Glass transition temperature: The epoxy resin composition was transferred and molded under such condition as mold temperature of 175° C., transfer pressure of 9.8 MPa, and curing time of 2 minutes, using a low-pressure transfer molding machine (KTS-30 manufactured by Kohtaki Precision Machine Co., Ltd.), to give a test specimen of 4 mm×4 mm×15 mm. The test specimen was post-cured for four hours at 175° C., and the linear expansion coefficient (α1) at the glass transition temperature of the cured composition or lower, and the linear expansion coefficient (α2) in the rubbery state of the test specimen were measured, based on a chart obtained through measurement by a thermal mechanical analysis equipment (TMA100 manufactured by Seiko Instruments Inc.) over a temperature range of 0° C. to 320° C. at a heating rate of 5° C./min., and the intersection of the respective extensions of α1 and α2 was defined as the glass transition temperature. The unit is ° C.

Linear expansion coefficient (α1): The epoxy resin composition was transferred and molded under such condition as mold temperature of 175° C., transfer pressure of 9.8 MPa, and curing time of 2 minutes, using the low-pressure transfer molding machine (KTS-30 manufactured by Kohtaki Precision Machine Co., Ltd., heating rate of 5° C./min.), to give a test specimen of 4 mm×4 mm×15 mm. The test specimen was post-cured for four hours at 175° C., and the linear expansion coefficient (α1) at the glass transition temperature of the cured composition or lower was measured. The unit is ppm/° C. The linear expansion coefficient (α1) exceeding 10 ppm creates an excessively large difference from the linear expansion coefficient of the substrate, which leads to an increase in warp of the package and in fluctuation in warp.

Gold wire sweep rate (BGA): A silicon chip and so forth were encapsulated by the epoxy resin composition under such condition as mold temperature of 175° C., transfer pressure of 6.9 MPa, and curing time of 2 minutes, in a low-pressure transfer molding machine (Y-series, manufactured by TOWA Corporation), to prepare a 352-pin BGA (a substrate used was a bismaleimidetriazine resin/glass cloth substrate having a thickness of 0.56 mm, a package size was 30 mm×30 mm×thickness 1.17 mm, and the silicon chip has a size of 10 mm×10 mm×thickness 0.35 mm, the chip and a bonding pad of the circuit substrate were bonded via a gold wire of 25 μm in diameter). The 352-pin BGA package was observed through a soft X-ray fluoroscope (PRO-TEST100, manufactured by SOFTEX Co., Ltd.), and the sweep rate of the gold wire was indicated by a ratio of sweep amount against the gold wire length. The evaluation criterion was set as "passed" for less than 5%, and "failed" for 5% or higher.

Gold wire sweep rate (LQFP): A silicon chip and so forth were encapsulated by the epoxy resin composition under such condition as mold temperature of 175° C., transfer pressure of 9.8 MPa, and curing time of 70 seconds, in a low-pressure transfer molding machine (GP-ELF, manufactured by Daiichi Seiko Co., Ltd), thereby obtaining a 160-pin LQFP (low-profile quad flat package; Copper lead frame, outer package size of 24 mm×24 mm×thickness 1.4 mm, pad size of 8.5 mm×8.5 mm, chip size of 7.4 mm×7.4 mm×thickness 350 mm). The 160-pin LQFP was observed through a soft X-ray fluoroscope (PRO-TEST100, manufactured by SOFTEX Co., Ltd.), and the sweep rate of the gold wire was indicated by a ratio of sweep amount against the gold wire length. The evaluation criterion was set as "passed" for less than 5%, and "failed" for 5% or higher.

Package warp characteristic: A silicon chip and so forth were encapsulated by the epoxy resin composition under such condition as mold temperature of 175° C., transfer pressure of 6.9 MPa, and curing time of 2 minutes, in the low-pressure transfer molding machine (Y-series, manufactured by TOWA Corporation), thereby obtaining a 352-pin BGA (a substrate used was a bismaleimidetriazine resin/glass cloth substrate having a thickness 0.56 mm, a package size was 30×30 mm×thickness 1.17 mm, the silicon chip has a size of 10×10 mm×thickness 0.35 mm, the chip and a bonding pad of the circuit substrate were bonded via a gold wire of 25 μm in diameter). The package was subjected to the process described below, after which the degree of the warp of the package was measured. To measure the degree of warp of the package, the package was placed with the encapsulated surface facing upward, and a displacement in a heightwise direction was measured in a diagonal direction from the gate of the package using a surface roughness tester, and a largest difference in displacement was taken as the degree of warp. Here, in the case that the package had a convex form, the displacement value was regarded as a negative value, and in the case that the package had a concave form, the value was regarded as a positive value (+ symbol is not expressed). The unit is μm.

Warp after molding: The degree of warp immediately after the molding process at 25° C.

Warp after exposure to heat: The degree of warp of the package at 25° C., after a post-curing process (at 175° C., for 4 hours), an IR reflow process (at 260° C., according to JEDEC condition), and a drying process at 125° C., for 8 hours.

Fluctuation in warp after exposure to heat: A difference in the degree of warp expressed as (W1−W2), W1 being the warp after the molding, and W2 being the warp after exposure to heat.

Warp at high temperature: The degree of warp measured when the temperature becomes uniform upon heating the package on a hot plate of 260° C., after the measurement of the warp after exposure to heat.

In case where the degree of warp immediately after the molding and after the post-curing is 80 μm or more, the conveyance of the package on the carrier may be disturbed. In case where the fluctuation in warp after exposure to heat is 40 μm or more, the conveyance of the package on the carrier may be disturbed after the molding and through the mounting process. Further, in case where the warp at high temperature exceeds −90 μm, defects in connection become more likely to arise in the mother board implementation process.

Examples 2 to 9, and Comparative Examples 1 to 7

Epoxy resin composition s were prepared according to the mixing ratios specified in Table 1 and 2 given below, through the steps according to the example 1, and evaluated according to the criteria described in the example 1. The evaluation results are shown in Table 1 and Table 2.

Following are the components employed, other than those used in the example 1.

Epoxy resin 2: A bisphenol A type crystalline epoxy resin (YL-6810 manufactured by Japan Epoxy Resin Co., Ltd., epoxy equivalent of 175, softening point of 45° C., melt viscosity at 150° C. measured by ICI melt viscosity meter of 0.10 poise).

Epoxy resin 4: A mixture prepared from β-naphthol, 2,7-dihydroxynaphthalene, and formaldehyde according to the foregoing process, containing 65 wt % of epoxy resin represented by formula (1) (n=0, and R2 is a hydrogen atom), 25 wt % of epoxy resin represented by formula (2) (m=0, n=0, and R2 is a hydrogen atom), and 10 wt % of epoxy resin represented by formula (3) (m=0, and R2 is a hydrogen atom) (epoxy equivalent of 212, softening point of 68° C.).

Epoxy resin 5: A mixture prepared from β-naphthol, 2,7-dihydroxynaphthalene, and formaldehyde according to the foregoing process, containing 85 wt % of epoxy resin represented by formula (1) (n=0, and R2 is a hydrogen atom), 10 wt % of epoxy resin represented by formula (2) (m=0, n=0, and R2 is a hydrogen atom), and 5 wt % of epoxy resin represented by formula (3) (m=0, and R2 is a hydrogen atom) (epoxy equivalent of 227, softening point of 67° C.).

Epoxy resin 6: A mixture containing 60 wt % of epoxy resin represented by formula (2) (m=0, n=0, and R2 is a hydrogen atom) prepared from β-naphthol, 2,7-dihydroxynaphthalene, and formaldehyde according to the foregoing prcess, and 40 wt % of epoxy resin represented by formula (3) (m=0, and R2 is a hydrogen atom) prepared from β-naphthol, 2,7-dihydroxynaphthalene, and formaldehyde according to the foregoing process (epoxy equivalent of 177, softening point of 85° C.).

Phenol resin curing agent 2: A phenol aralkyl resin having a biphenylene structure (MEH-7851SS manufactured by Meiwa Plastic Industries, Ltd., hydroxyl group equivalent of 203, softening point of 66° C.)

TABLE 1

| | EXAMPLE | | | | | | | | |
|---|---|---|---|---|---|---|---|---|---|
| | 1 | 2 | 3 | 4 | 5 | 6 | 7 | 8 | 9 |
| EPOXY RESIN 1 | 6.14 | 3.64 | 5.43 | 6.13 | 6.48 | 4.72 | 5.59 | 5.57 | 5.53 |
| EPOXY RESIN 2 | | 2.43 | | | | | | | |
| EPOXY RESIN 3 | 1.10 | 1.08 | 1.81 | | 0.72 | 2.54 | | 0.72 | 1.07 |
| EPOXY RESIN 4 | | | | 1.10 | | | 1.67 | | |
| EPOXY RESIN 5 | | | | | | | | | |
| EPOXY RESIN 6 | | | | | | | | 0.90 | |
| PHENOL RESIN CURING AGENT 1 | 3.96 | 4.05 | 3.96 | 3.97 | 4.00 | 3.94 | 3.94 | 4.01 | 2.23 |
| PHENOL RESIN CURING AGENT 2 | | | | | | | | | 2.37 |
| INORGANIC FILLER | 88.00 | 88.00 | 88.00 | 88.00 | 88.00 | 88.00 | 88.00 | 88.00 | 88.00 |
| CURING ACCELERATOR | 0.20 | 0.20 | 0.20 | 0.20 | 0.20 | 0.20 | 0.20 | 0.20 | 0.20 |
| MOLD RELEASE AGENT | 0.20 | 0.20 | 0.20 | 0.20 | 0.20 | 0.20 | 0.20 | 0.20 | 0.20 |
| COUPLING AGENT 1 | 0.10 | 0.10 | 0.10 | 0.10 | 0.10 | 0.10 | 0.10 | 0.10 | 0.10 |
| COUPLING AGENT 2 | 0.10 | 0.10 | 0.10 | 0.10 | 0.10 | 0.10 | 0.10 | 0.10 | 0.10 |
| COLORING AGENT | 0.20 | 0.20 | 0.20 | 0.20 | 0.20 | 0.20 | 0.20 | 0.20 | 0.20 |
| RATIO OF (a1)/(A) [WT %] | 84.8 | 84.9 | 75.0 | 84.8 | 90.0 | 65.0 | 77.0 | 77.5 | 83.8 |
| RATIO OF (a2)/(A) [WT %] | 7.6 | 7.6 | 12.5 | 9.9 | 5.0 | 17.5 | 15.0 | 5.0 | 8.1 |
| RATIO OF (a3)/(A) [WT %] | 7.6 | 7.6 | 12.5 | 5.3 | 5.0 | 17.5 | 8.1 | 17.5 | 8.1 |
| SPIRAL FLOW [cm] | 120 | 140 | 105 | 125 | 135 | 102 | 115 | 110 | 115 |
| GLASS TRANSITION TEMPERATURE [° C.] | 156 | 153 | 162 | 154 | 153 | 168 | 158 | 165 | 153 |
| LINEAR EXPANSION COEFFICIENT [ppm/° C.] | 8.2 | 8.4 | 7.8 | 8.2 | 8.6 | 7.6 | 7.8 | 7.6 | 8.9 |
| GOLD WIRE SWEEP RATE (BGA) [%] | 3.8 | 2.0 | 5.3 | 3.5 | 2.4 | 5.4 | 4.3 | 4.8 | 4.2 |
| GOLD WIRE SWEEP RATE (LQFP) [%] | 2.8 | 1.8 | 4.3 | 2.5 | 2.0 | 4.5 | 3.5 | 3.7 | 3.3 |
| WARP CHARACTERISTIC WARP AFTER MOLDING | 60 | 63 | 54 | 62 | 63 | 50 | 57 | 53 | 65 |

TABLE 1-continued

| | | EXAMPLE | | | | | | | | |
|---|---|---|---|---|---|---|---|---|---|---|
| | | 1 | 2 | 3 | 4 | 5 | 6 | 7 | 8 | 9 |
| OF PACKAGE [μm] | WARP AFTER EXPOSURE TO HEAT | 30 | 29 | 29 | 29 | 30 | 29 | 29 | 30 | 30 |
| | FLUCTUATION IN WARP AFTER EXPOSURE TO HEAT | 30 | 34 | 25 | 33 | 33 | 21 | 28 | 23 | 35 |
| | WARP AT HIGH TEMPERATURE | −70 | −63 | −72 | −62 | −61 | −73 | −68 | −72 | −60 |

TABLE 2

| | COMPARATIVE EXAMPLE | | | | | | |
|---|---|---|---|---|---|---|---|
| | 1 | 2 | 3 | 4 | 5 | 6 | 7 |
| EPOXY RESIN 1 | 6.12 | 6.08 | 6.45 | 6.82 | 7.49 | 3.65 | |
| EPOXY RESIN 2 | | | | | | | |
| EPOXY RESIN 3 | | | | | | 3.65 | 7.42 |
| EPOXY RESIN 4 | | | | | | | |
| EPOXY RESIN 5 | 1.14 | | | | | | |
| EPOXY RESIN 6 | | 1.09 | 0.72 | 0.36 | | | |
| PHENOL RESIN CURING AGENT 1 | 3.94 | 4.03 | 4.03 | 4.02 | 3.71 | 3.90 | 3.78 |
| PHENOL RESIN CURING AGENT 2 | | | | | | | |
| INORGANIC FILLER | 88.00 | 88.00 | 88.00 | 88.00 | 88.00 | 88.00 | 88.00 |
| CURING ACCELERATOR | 0.20 | 0.20 | 0.20 | 0.20 | 0.20 | 0.20 | 0.20 |
| MOLD RELEASE AGENT | 0.20 | 0.20 | 0.20 | 0.20 | 0.20 | 0.20 | 0.20 |
| COUPLING AGENT 1 | 0.10 | 0.10 | 0.10 | 0.10 | 0.10 | 0.10 | 0.10 |
| COUPLING AGENT 2 | 0.10 | 0.10 | 0.10 | 0.10 | 0.10 | 0.10 | 0.10 |
| COLORING AGENT | 0.20 | 0.20 | 0.20 | 0.20 | 0.20 | 0.20 | 0.20 |
| RATIO OF (a1)/(A) [WT %] | 84.3 | 84.8 | 90.0 | 95.0 | 100.0 | 50.0 | 0.0 |
| RATIO OF (a2)/(A) [WT %] | 13.3 | 0.0 | 0.0 | 0.0 | 0.0 | 25.0 | 50.0 |
| RATIO OF (a3)/(A) [WT %] | 2.4 | 15.2 | 10.0 | 5.0 | 0.0 | 25.0 | 50.0 |
| SPIRAL FLOW [cm] | 108 | 62 | 76 | 110 | 152 | 72 | 39 |
| GLASS TRANSITION TEMPERATURE [° C.] | 146 | 165 | 152 | 139 | 121 | 169 | 181 |
| LINEAR EXPANSION COEFFICIENT [ppm/° C.] | 8.9 | 7.8 | 8.5 | 9.2 | 11.8 | 8.5 | 7.1 |
| GOLD WIRE SWEEP RATE (BGA) [%] | 5.1 | 7.9 | 6.6 | 5.2 | 1.6 | 7.1 | >9.0 |
| GOLD WIRE SWEEP RATE (LQFP) [%] | 4.0 | 6.8 | 5.4 | 4.0 | 1.3 | 6.3 | 8.0 |
| WARP CHARACTERISTIC OF PACKAGE [μm] — WARP AFTER MOLDING | 92 | 53 | 68 | 86 | 118 | 54 | 32 |
| WARP AFTER EXPOSURE TO HEAT | 44 | 35 | 32 | 14 | 6 | 42 | 24 |
| FLUCTUATION IN WARP AFTER EXPOSURE TO HEAT | 48 | 18 | 36 | 72 | 112 | 12 | 8 |
| WARP AT HIGH TEMPERATURE | −82 | −72 | −68 | −72 | −108 | −87 | −132 |

In examples 1 to 9, which are different in type and mixing ratio of the component (a1), mixing ratio of the component (a2) and the component (a3), and type of the phenol resin curing agent, the obtained compositions have desired properties such as a spiral flow of 80 cm or more measured according to EMMI-1-66, a glass transition temperature of 150° C. or higher in the cured state, and a linear expansion coefficient of 5 ppm/° C. to 10 ppm/° C. in the cured state at a temperature not higher than the glass transition temperature, by using the component (a1), the component (a2), and the component (a3) as essential components of the epoxy resin, and adjusting the mixing ratio of the component (a1), the component (a2), and the component (a3) within an appropriate range, and in all of those compositions, an excellent balance between the gold wire sweep rate and the package warp characteristic was accomplished. Further, the compositions in the examples 1, 2, 4, and 5 had a spiral flow of 120 cm or more measured according to EMMI-1-66, as well as excellent results with respect to the gold wire sweep in the BGA by setting the mixing ratio of the component (a1), the component (a2), and the component (a3) within the appropriate range.

On the other hand, the comparative example 1 which, while containing all the essential epoxy resins, i.e. the component (a1), the component (a2), and the component (a3), contains only a small amount of component (a3), and the glass transition temperature of which in the cured state is lower than 150° C., showed inferior results in warp of the package, especially in warp after molding and fluctuation in warp after exposure to heat, though a good result was obtained in gold wire sweep rate when built into the LQFP.

Referring to the comparative example 2 to 5, the composition of these comparative examples are slightly different in mixing ratio of the component (a1) and the component (a3) from one another, and do not include any component (a2) as an epoxy resin. The comparative example 2 containing a relatively large amount of the component (a3) such that the spiral flow remains below 80 cm exhibited a poor result in gold wire sweep rate, though a good result was obtained in package warp characteristic. In contrast, the comparative example 5 in which the component (a3) was reduced to zero, so that the glass transition temperature would become below 150° C. and the linear expansion coefficient would exceed 10 ppm/° C., showed inferior results in warp of the package, especially in warp after molding and fluctuation in warp after exposure to heat, though a good results were obtained in warp at high temperature and gold wire sweep rate. The comparative examples 3 and 4, which have intermediate contents between the comparative example 2 and the comparative example 5, failed to show a good result in neither gold wire sweep rate nor package warp characteristic.

Further, the comparative example 6 which, while containing all the essential epoxy resins, i.e. the component (a1), the component (a2), and the component (a3), contains only a small amount of component (a1), and the spiral flow of which was hence shorter than 80 cm, showed a poor result in gold wire sweep rate, though a good result was obtained in package warp characteristic.

Further, the comparative example 7 which does not contain any component (a1) while containing the component (a2) and the component (a3) in the epoxy resin category, and the spiral flow of which was hence by far shorter than 80 cm, showed significantly inferior result in gold wire sweep rate. Besides, because of the increased elasticity of the cured resin composition at high temperature, poor result was shown in warp at high temperature.

Thus, it has been proved that the epoxy resin composition for encapsulating a semiconductor according to the present invention exhibits an excellent balance between the gold wire sweep rate and the package warp characteristic.

The present invention provides an epoxy resin composition with high flowability and low stress generation property, which exhibits, especially in a manufacturing process of an area surface mount semiconductor package, an excellent warp characteristic, particularly the warp after being exposed to a high temperature, and can therefore be appropriately applied to an area surface mount type semiconductor device.

It is apparent that the present invention is not limited to the above embodiment, and may be modified and changed without departing from the scope and spirit of the invention.

What is claimed is:

1. An epoxy resin composition for encapsulating a semiconductor comprising an epoxy resin (A),
   wherein the epoxy resin (A) includes:
     a crystalline epoxy resin (a1) having a melting point of 50° C. to 150° C.,
     an epoxy resin (a2) represented by formula (1), and
     at least one epoxy resin (a3) selected from an epoxy resin represented by formula (2) and an epoxy resin represented by a formula (3),
   wherein the epoxy resin (a1) is different from the epoxy resin (a2) and the epoxy resin (a3);
   wherein the composition has a spiral flow of 80 cm or more measured according to EMMI-1-66 method;
   the composition in the cured state has a glass transition temperature of 150° C. or higher; and
   the composition in the cured state has a linear expansion coefficient of 5 ppm/° C. to 10 ppm/° C., at a temperature not higher than the glass transition temperature of the composition:

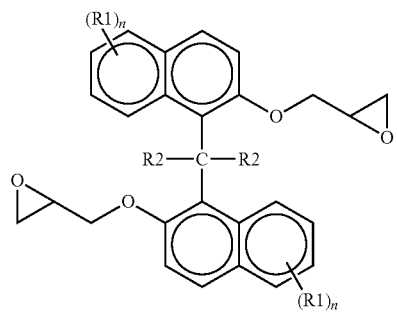

wherein, in formula (1), R1's which may be the same or different, represent a hydrocarbon group having 1 to 4 carbon atoms; R2's, which may be same or different, represent a hydrogen atom or a hydrocarbon group having 1 to 4 carbon atoms; and n is an integer of 0 to 6;

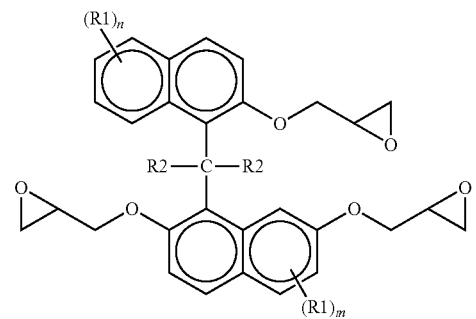

wherein, in formula (2), R1's, which may be same or different, represent a hydrocarbon group having 1 to 4 carbon atoms; R2's, which may be the same or different, represent a hydrogen atom or a hydrocarbon group having 1 to 4 carbon atoms; m is an integer of 0 to 5; and n is an integer of 0 to 6;

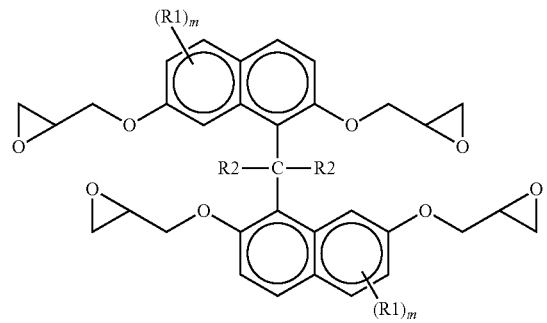

wherein, in formula (3), R1's which may be the same or different, represent a hydrocarbon group having 1 to 4 carbon atoms; R2's, which may be the same or different, represent a hydrogen atom or a hydrocarbon group having 1 to 4 carbon atoms; and m is an integer of 0 to 5, and
wherein the epoxy resin (a1) is in an amount of 60 wt % to 95 wt % based on the total amount of the epoxy resin (a1), the epoxy resin (a2), and the epoxy resin (a3).

2. The epoxy resin composition according to claim 1, wherein the crystalline epoxy resin (a1) is at least one selected from the group consisting of a biphenyl type epoxy resin, a bisphenol type epoxy resin, a stilbene type epoxy resin, a dihydroxybenzene type epoxy resin, and a naphthalene type epoxy resin.

3. The epoxy resin composition according to claim 1, wherein the epoxy resin (a1) is in an amount of 60 wt % to 95 wt %, the epoxy resin (a2) is in an amount of 2.5 wt % to 20 wt %, and the epoxy resin (a3) is in an amount of 2.5 wt % to 20 wt %, based on the total amount of the epoxy resin (a1), the epoxy resin (a2), and the epoxy resin (a3).

4. The epoxy resin composition according to claim 1, further comprising a phenol resin curing agent (B).

5. The epoxy resin composition according to claim 1, further comprising an inorganic filler (C).

6. The epoxy resin composition according to claim 5, wherein the content of the inorganic filler (C) is 80 wt % to 92 wt % based on the total amount of the epoxy resin composition.

7. The epoxy resin composition according to claim 1, further comprising a curing accelerator (D).

8. The epoxy resin composition according to claim 1, wherein the composition has a spiral flow of 120 cm or more measured according to EMMI-1-66 method.

9. A semiconductor device comprising a semiconductor chip encapsulated with the epoxy resin composition for encapsulating a semiconductor according to claim 1.

10. An epoxy resin composition for encapsulating an area surface mount semiconductor, wherein the area surface mount semiconductor comprises a semiconductor chip mounted on substantially one side of a substrate by encapsulating with the composition according to claim 1.

11. An area surface mount semiconductor device, comprising a semiconductor chip mounted on one side of a substrate; wherein the semiconductor chip on one side of the substrate is encapsulated with the epoxy resin composition for encapsulating an area surface mount semiconductor according to claim 10.

12. The epoxy resin composition according to claim 1, wherein the epoxy resin (a1) is in an amount of 65 wt % to 90 wt % and the amount of epoxy resin (a3) is in an amount of 5 wt % to 20 wt % of based on the total amount of the epoxy resin (a1), the epoxy resin (a2), and the epoxy resin (a3).

13. The epoxy resin composition according to claim 1, wherein the wt % of epoxy resin (a1) based on the total amount of the epoxy resin (a1), the epoxy resin (a2), and the epoxy resin (a3) provides the epoxy resin composition with an excellent balance between the gold wire sweep rate and the warp characteristic.

14. An epoxy resin composition for encapsulating a semiconductor comprising an epoxy resin (A),
wherein the epoxy resin (A) includes:
a crystalline epoxy resin (a1) having a melting point of 50° C. to 150° C.,
an epoxy resin (a2) represented by formula (1), and
at least one epoxy resin (a3) selected from an epoxy resin represented by formula (2) and an epoxy resin represented by a formula (3),
wherein the epoxy resin (a1) is different from the epoxy resin (a2) and the epoxy resin (a3);
wherein the composition has a spiral flow of 80 cm or more measured according to EMMI-1-66 method;
the composition in the cured state has a glass transition temperature of 150° C. or higher; and
the composition in the cured state has a linear expansion coefficient of 5 ppm/° C. to 10 ppm/° C., at a temperature not higher than the glass transition temperature of the composition:

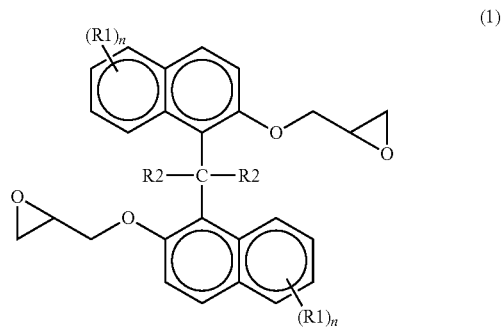

(1)

wherein, in formula (1), R1's which may be the same or different, represent a hydrocarbon group having 1 to 4 carbon atoms; R2's, which may be same or different, represent a hydrogen atom or a hydrocarbon group having 1 to 4 carbon atoms; and n is an integer of 0 to 6;

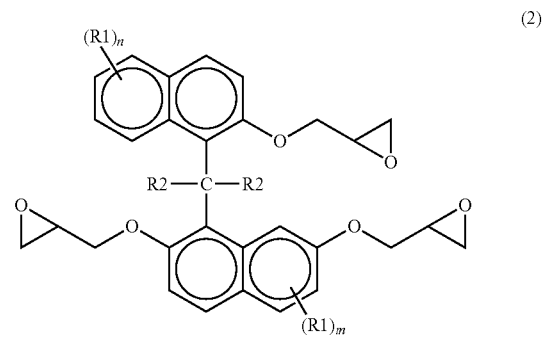

(2)

wherein, in formula (2), R1's which may be same or different, represent a hydrocarbon group having 1 to 4 carbon atoms; R2's, which may be the same or different, represent a hydrogen atom or a hydrocarbon group having 1 to 4 carbon atoms; m is an integer of 0 to 5; and n is an integer of 0 to 6;

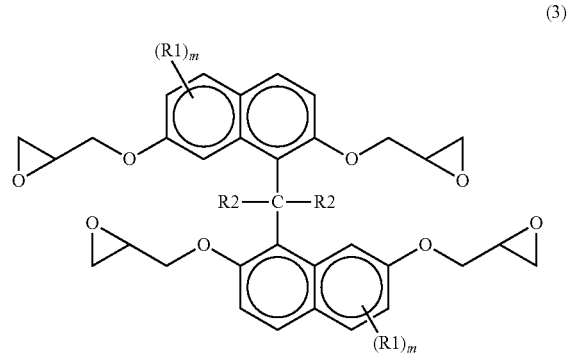

(3)

wherein, in formula (3), R1's which may be the same or different, represent a hydrocarbon group having 1 to 4 carbon atoms; R2's, which may be the same or different, represent a hydrogen atom or a hydrocarbon group having 1 to 4 carbon atoms; and m is an integer of 0 to 5,
wherein the epoxy resin (a1) is in an amount of 60 wt % to 95 wt % based on the total amount of the epoxy resin (a1), the epoxy resin (a2), and the epoxy resin (a3), and wherein the epoxy resin (a2) is in an amount of 2.5 wt % to 20 wt %, and the epoxy resin (a3) is in an amount of 2.5 wt % to 20 wt %, based on the total amount of the epoxy resin (a1), the epoxy resin (a2), and the epoxy resin (a3).

\* \* \* \* \*